United States Patent [19]

Nagumo

[11] Patent Number: 5,368,497
[45] Date of Patent: Nov. 29, 1994

[54] IC SOCKET

[75] Inventor: Takayuki Nagumo, Sagamihara, Japan

[73] Assignee: Minnesota Mining and Manufacturing Company, St. Paul, Minn.

[21] Appl. No.: 74,207

[22] Filed: Jun. 9, 1993

[30] Foreign Application Priority Data

Jun. 10, 1992 [JP] Japan .................................. 4-150293

[51] Int. Cl.5 .............................................. H01R 11/22
[52] U.S. Cl. ................................ 439/266; 439/331
[58] Field of Search ................................ 439/68–73, 439/259–270, 330, 331

[56] References Cited

U.S. PATENT DOCUMENTS

| | | | |
|---|---|---|---|
| 4,846,703 | 7/1989 | Matsuoka et al. | 439/71 |
| 4,846,704 | 7/1989 | Ikeya | 439/72 |
| 4,886,470 | 12/1989 | Billman et al. | 439/266 |
| 4,993,955 | 2/1991 | Savant | 439/73 |
| 5,076,798 | 12/1991 | Uraksuji | 439/269 |
| 5,114,358 | 5/1992 | Myers | 439/266 |

Primary Examiner—Gary F. Paumen
Assistant Examiner—Hien D. Vu
Attorney, Agent, or Firm—Gary L. Griswold; Walter N. Kirn; John C. Barnes

[57] ABSTRACT

The IC socket is capable of obtaining a stable engaging force to meet variations in thickness of the lead of an IC package, when the IC socket comprises a socket body, a plurality of contacts which are arranged on the socket body to be engaged with a plurality of leads while being resiliently depressed from above and a cover which is provided to be vertically movable for the socket body and to depress the contacts to displace them outwardly against their resilience to allow the contacts out of the electrical engagement when the cover is moved down, when the plurality of contacts respectively have a fixing portion which is fixed to the socket body, a contact portion for electrical engagement with the lead (L) of the IC package (P), a cantilever portion which enables the release of the lead (L) and the contact from electrical engagement by rotating or pivoting around the contact portion, and an engaging portion which comes into sliding engagement with the cover, the distance from the contact portion to the bottom side of the contact fixing portion of the single contact before it is inserted into the socket body is smaller than the same distance after mounting the contact in the socket body to provide a preloaded engaging force between the contact and the IC package on the socket body.

4 Claims, 18 Drawing Sheets

1

IC SOCKET

BACKGROUND OF THE INVENTION

1. Field of the Invention

The present invention relates to an IC socket which comprises a socket body, a cover and a plurality of contacts and performs electrical engagement and disengagement of said contacts with the leads of an IC package, and, more specifically, an improvement of contact reliability of the IC socket concerned.

2. Description of the Prior Art

Generally, all IC packages are subject to screening inspections in several methods to ensure their original functions. One of these screening inspections of the IC packages is a burn-in test, which is intended to test high temperature characteristics of IC packages by setting the IC packages mounted on IC sockets in a convective oven and actuating them in a high temperature environment.

FIGS. 15 to 18 respectively show an IC socket applicable to an automatic machine for use in the burn-in test disclosed in the U.S. Pat. No. 4,886,470. More specifically, FIG. 15 is a perspective view showing a normal condition before the screening inspection. FIG. 16 is a cross sectional view showing the IC socket on which an IC package is mounted. FIG. 17 is a cross sectional view showing the operating condition and FIG. 18 is a load-displacement characteristic view of the contacts.

This IC socket comprises a socket body 1', a cover 2' and a plurality of contacts 3' as shown. This plurality of contacts 3' respectively have a contact portion 31' for electrical engagement with a lead L of the IC package P, a cantilever portion 32' for rotating this contact portion 31' to allow electrical disengagement of the lead L from the contact 3', and an engaging portion which slides to engage with the cover 2'. In this case, when the cover 2' is depressed downwardly against the resilience (repulsive force) of the contacts 3', the contacts 3' are forcibly displaced outwardly and the contacts 3' and the lead L of the IC package P are released from electrical engagement. Under this condition, therefore, the IC package P can be remounted. When a force for depressing the cover 2' is removed, the contacts 3' are turned around in a opposite direction to the aforementioned direction and connected again with the lead L of the IC package P.

However, in the above-described IC socket, an engaging force between the contact and the lead (L) has been obtained as a resilient repulsive force which would cause the contact to be displaced by as much as the thickness of the lead (L) as shown in FIG. 16 and therefore, if the IC package (P) having the leads (L) with a different thickness is used, a variation in the thickness of the lead (L) has greatly affected the engaging force and a stable engaging force could not be obtained and consequently a stable electrical contact resistance could not be obtained. In addition, there has been a problem that an error of thickness of the leads (L) resulting from manufacturing affects significantly effects the electrical contact resistance. Accordingly, to obtain a stable engaging force, that is, a stable electrical contact resistance, it has been necessary to change the resilience of the contact 3' in accordance with the thickness of the lead (L) of the IC package (P) or partly change the shape of the contact 3' and the socket body 1' and moreover prepare various IC sockets to meet variations in the thickness of the lead (L).

An object of the present invention which was made in view of the above problems is to provide an IC socket capable of providing a stable engaging force in response to variations in the thickness of the lead (L) of the IC package (P).

SUMMARY OF THE INVENTION

In an IC socket which comprises a socket body, a plurality of contacts which are arranged on the socket body to be engaged with a plurality of leads (L) of an IC package (P) having gull wing-type leads (L type leads), while being resiliently depressed from above, and a cover which is provided to be vertically movable for the socket body and to depress the contacts to displace them outwardly against their resilience to allow the contacts to move out of the electrical engagement when the cover is moved down, said plurality of contacts respectively having a fixing portion which is fixed to the socket body, a contact portion for electrical engagement with a lead (L) of the IC package (P), a cantilever portion which enables the release of the lead (L) and the contact from electrical engagement by rotating or pivoting the contact portion, and an engaging portion which slides to come in engagement with the cover, the distance from the contact portion to the bottom side of the contact fixing portion of a single contact when an external force is not applied is smaller than the distance from the bottom surface of the contact fixing portion of the socket body to the IC package (P) mounting portion.

A contact point portion for the socket body is provided near the contact portion, a mating portion is provided at a position of the socket body corresponding to the contact point portion, and the distance from the contact point portion to the bottom side of the contact fixing portion of the single contact when an external force is not applied is smaller than the distance from the bottom surface of the contact fixing portion of the socket body to the mating portion of the socket body.

In the IC socket according to the present invention, a depressing force can be applied to the contact portion which comes in contact with the lead L or a portion near the contact portion before mounting the IC package P by installing the contact having the same relative dimensions to the socket body as described above and therefore a stable engaging force can be obtained to meet variations in the thickness of the lead L and a stable electrical contact resistance can be obtained accordingly.

DETAILED DESCRIPTION OF THE PRESENTLY PREFERRED EMBODIMENTS

Figure 1:
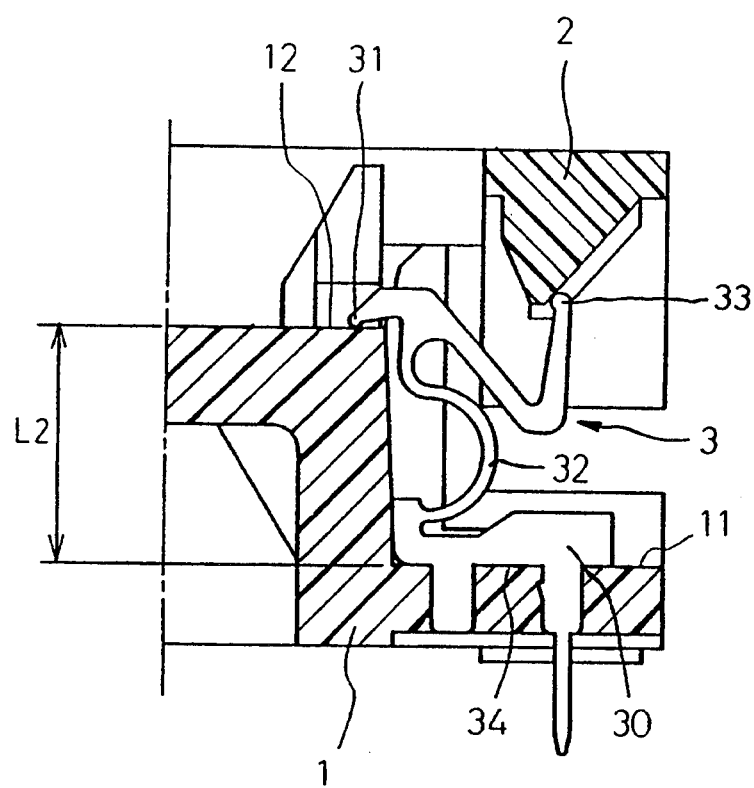
FIG. 1 is a cross-sectional view of a socket according to an embodiment of the present invention showing the regular condition of the IC socket before the test.
Figure 2:
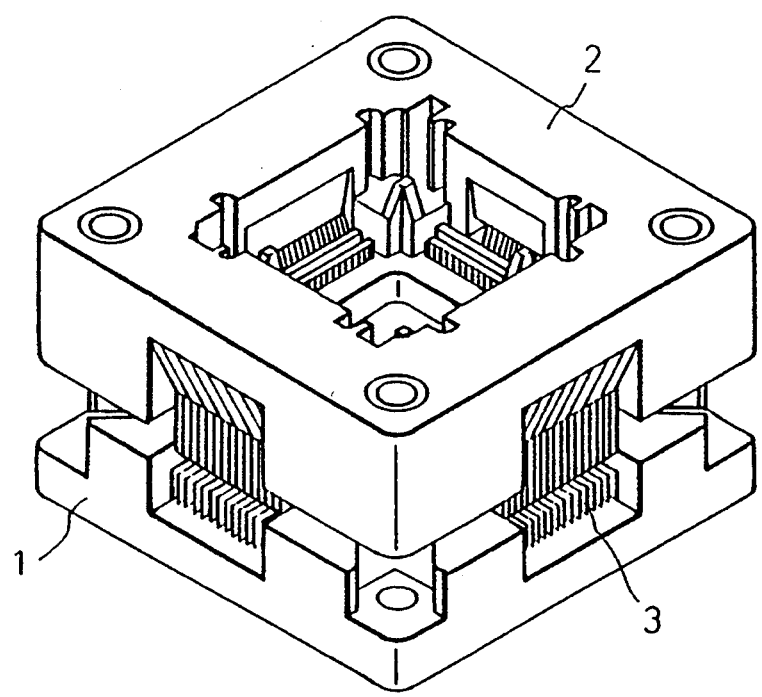
FIG. 2 is a perspective view showing the regular condition of the IC socket before installation according to an embodiment of the present invention.
Figure 3:
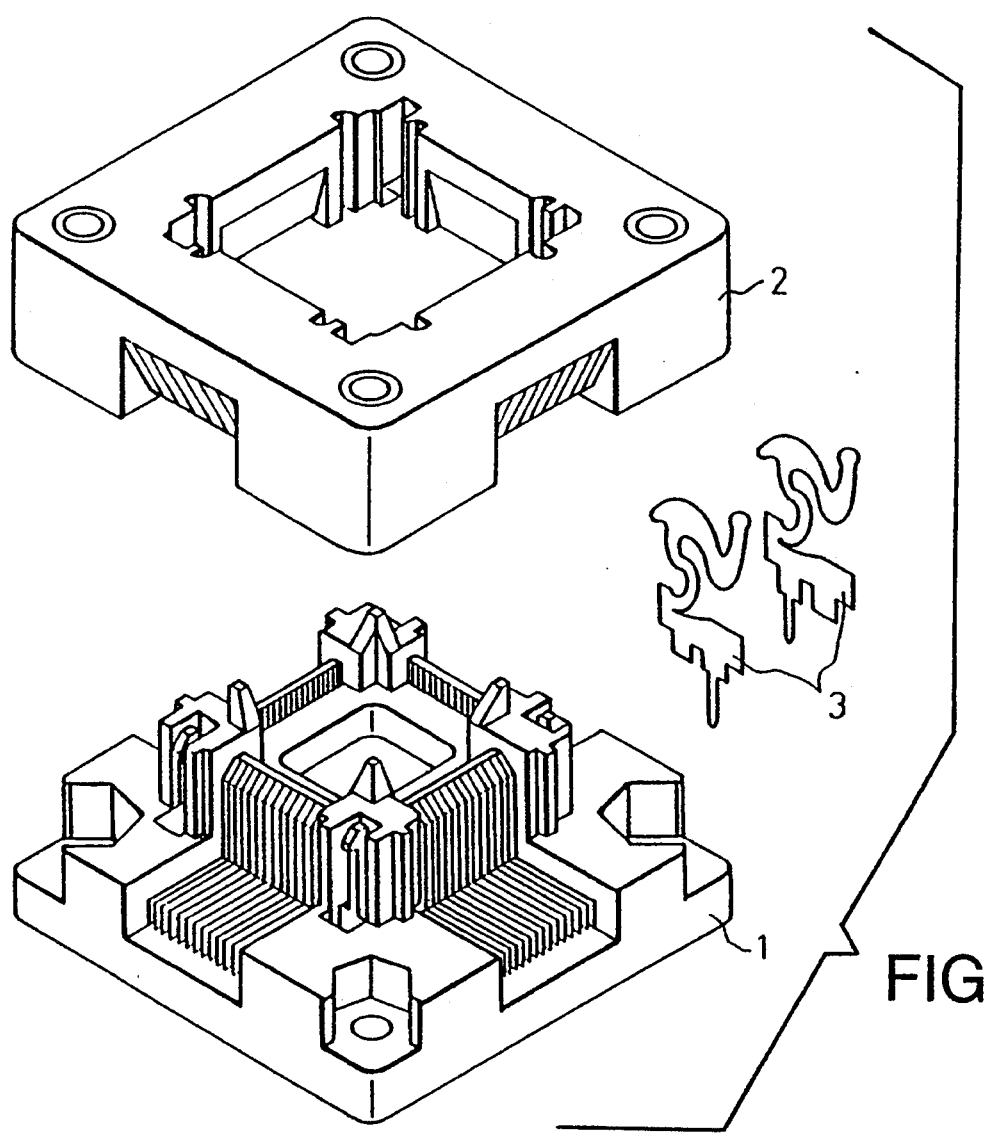
FIG. 3 is a perspective view showing the overall construction of the IC socket according to an embodiment of the present invention.
Figures 4A, 4B:
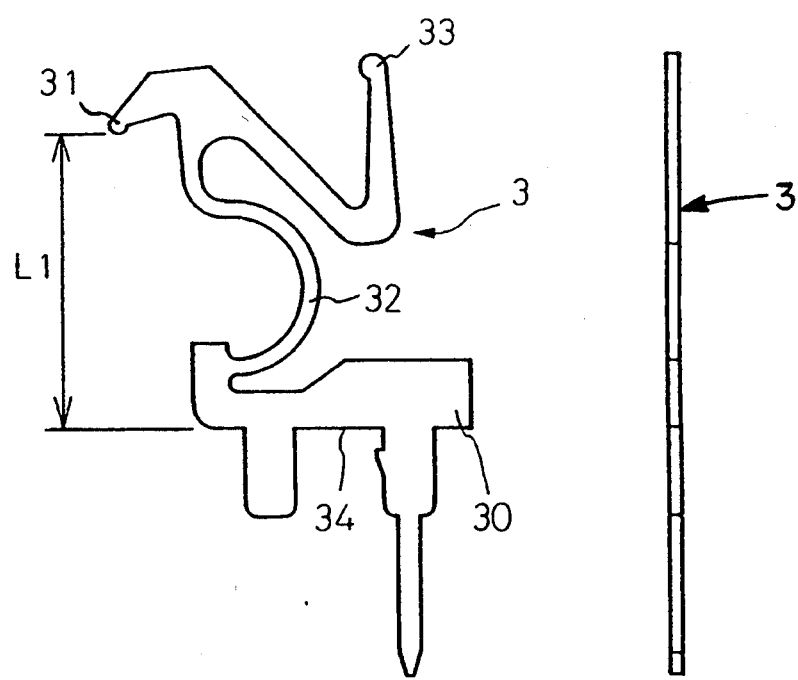
FIG. 4a is an elevational view showing a single contact of the IC socket before installation according to an embodiment of the present invention and FIG. 4b is a side view.
Figure 5:
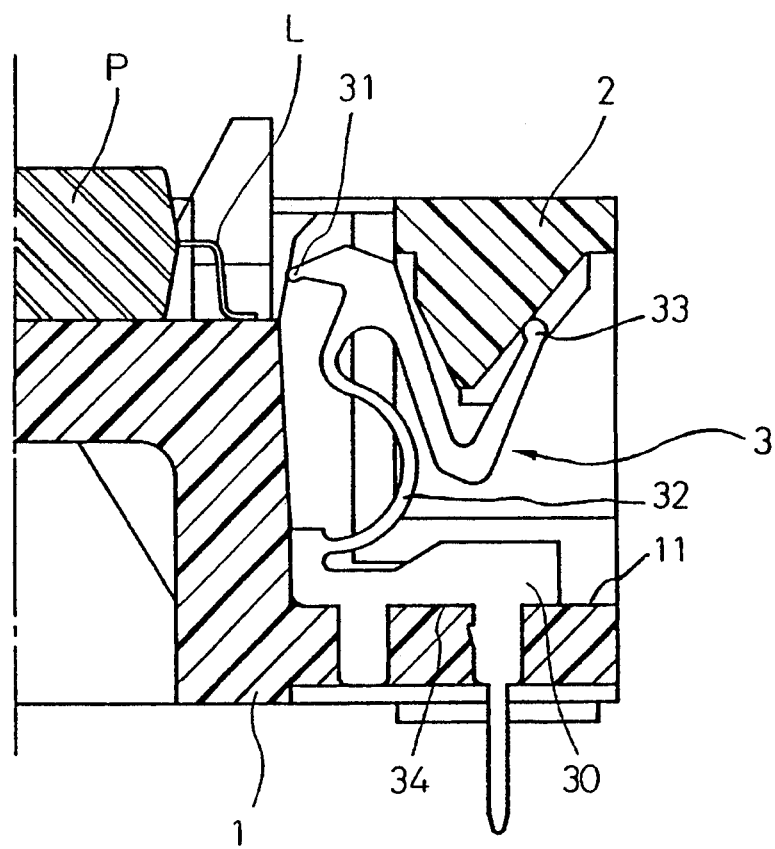
FIG. 5 is a cross-sectional view showing an operating condition of the IC socket according to an embodiment of the present invention.
Figure 6:
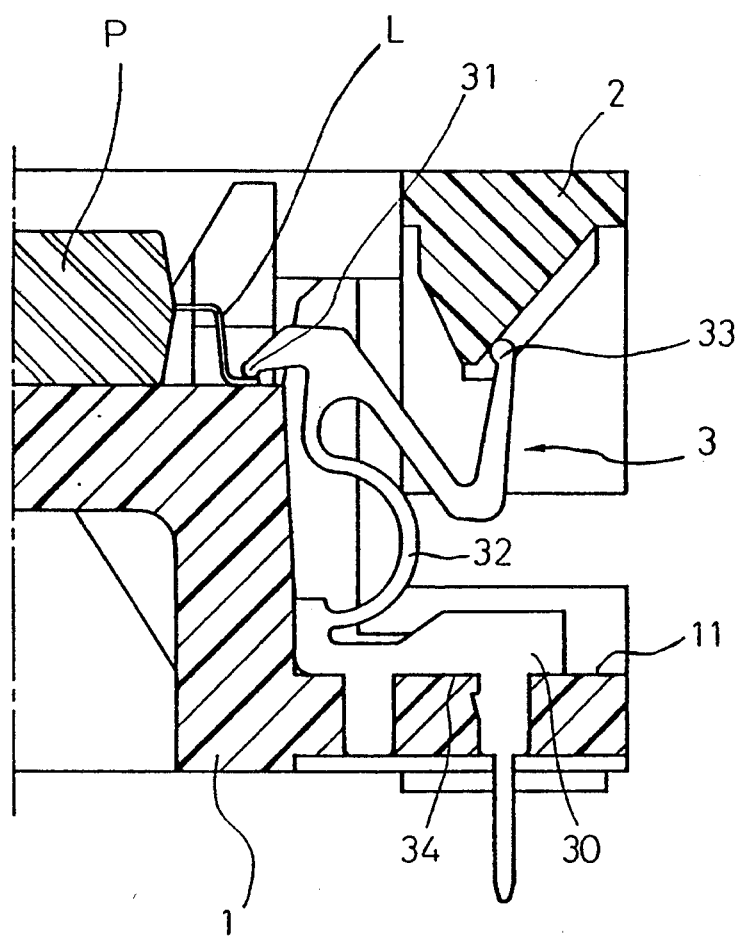
FIG. 6 is a cross-sectional view of the IC package mounting condition of the IC socket according to an embodiment of the present invention.
Figure 7:
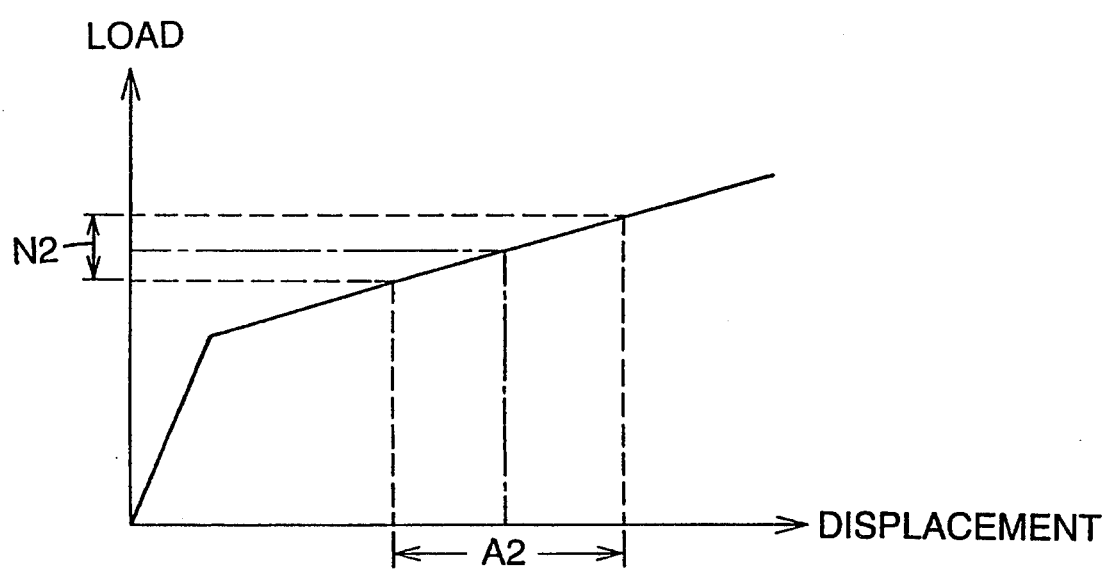
FIG. 7 is a load-displacement characteristic diagram of the contacts of the IC socket according to an embodiment of the present invention.

FIGS. 1 to 7 respectively show an embodiment of the IC socket according to the present invention. More specifically, FIG. 1 is a cross-sectional view showing a regular condition before the test, FIG. 2 is a perspective view showing a regular condition before the inspection. FIG. 3 is a perspective view showing the overall construction, FIG. 4 is an elevation of a single contact before mounting, FIG. 5 is a cross-sectional view showing the operating condition, FIG. 6 is a cross-sectional view showing the IC package mounted, and FIG. 7 is a load-displacement characteristic of the contact.

The IC socket comprises a socket body 1, a cover 2 and a plurality of contacts 3 as shown in FIG. 4a and 4b. The socket body 1 comprises an IC package P mounting portion 12 and a contact fixing portion, having a mounting surface 11. The contacts 3, respectively, have a contact fixing portion 30, having a bottom side 34, a contact portion 31 for electrical engagement with a lead L of the IC package P, a cantilever portion 32 affording rotation of the contact portion 31, and an engaging cam portion 33 which comes into sliding engagement with the cover 2. As shown in FIG. 1 and FIG. 4a, the distance L1 from the contact portion 31 of a single contact 3, as shown in FIGS. 1 and 4a, which comes in engagement with the lead L (see FIG. 5) when no external force is not applied is determined to be smaller than the distance L2 from the bottom side 34 of the fixing portion 30 or mounting surface 11 of the contact fixing portion of the socket body to the IC package P mounting portion 12. Accordingly, a depressing force can be applied to the contact portion 31 of the contact before mounting the IC package P by installing the contact 3 having the relative dimensions as described above in the socket body 1. More specifically, the load-displacement characteristic (preloading of the contact portion) is as shown in FIG. 7 and the variation of the engaging pressure is N2 in reference to the variation A2 in the thickness of lead L. If the resilience factor of the contact 3 is set to be smaller than the resilience factor of contact 3' of the conventional IC socket, the variation of the engaging pressure is N1>N2 in case the variations of the thickness of lead L are the same, that is, A1=A2. Accordingly, the variations of the engaging pressure are smaller than in the case of the conventional IC socket and therefore a stable engaging force can be obtained in the event of the variations in thickness of lead L.

Figure 8:
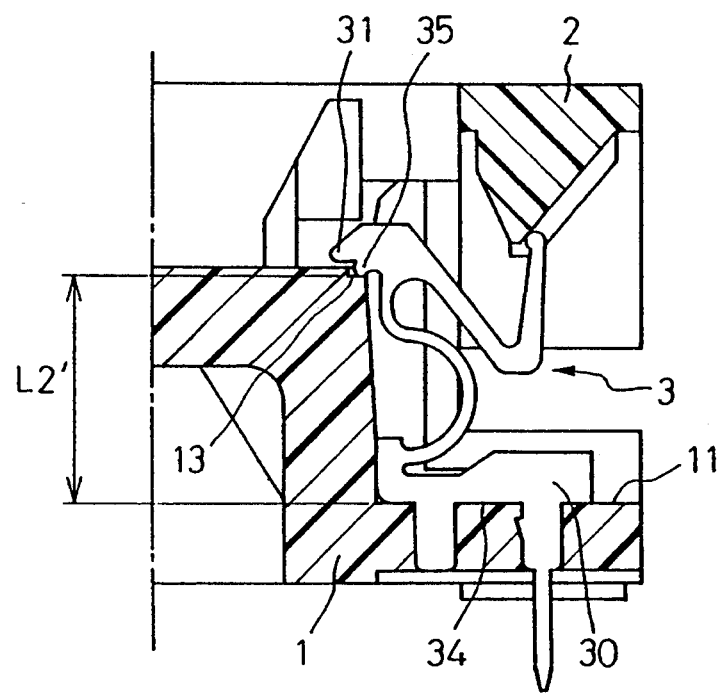
FIG. 8 is a cross-sectional view showing the regular condition of the IC socket before the test according to another embodiment of the present invention.
Figure 9A:
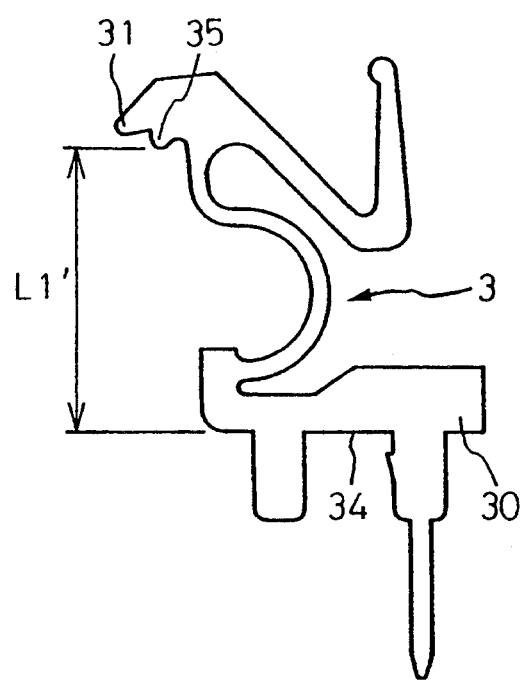
FIG. 9a is an elevational view showing a single contact of the IC socket before installation according to another embodiment of the present invention and FIG. 9b is a side view.
Figure 9B:
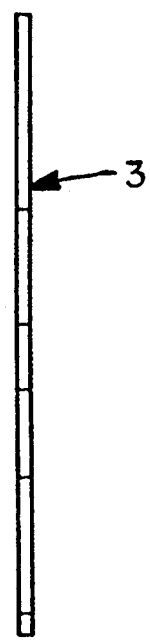

FIGS. 8 and 9 respectively show another embodiment of the present invention. In this case, while the construction in the above-described embodiment is such that a depressing force before mounting the IC package P is applied with the contact portion 31 of the contact 3, a contact point portion 35 (a depressing point before mounting the IC package) for the socket body 1 is provided near a contact portion 31 of the contact 3 and a distance L1' from the contact point portion 35 of a single contact 3 for the socket body 1 to a bottom side 34 of fixing portion is determined to be smaller than a distance L2' from the surface 11 of a contact fixing portion of the socket body 1 to an IC package mounting mating portion 13 of the socket body 1. Also in this case, since the lead-displacement characteristic is similar to that in the above-described embodiment and a depressing force can be applied to the contact point portion 35 before mounting the IC package P on the IC package mounting portion 13, a stable engaging force can be obtained to meet the variations of the thickness of the lead L. In this embodiment, the contact portion 31 of the contact 3 which comes in contact with the lead L does not engage with the socket body 1 and therefore it is advantageous in that the contact portion 31 is free from foreign matter due to wearing of the material forming the socket body 1, which is produced during operation.

Figure 10:
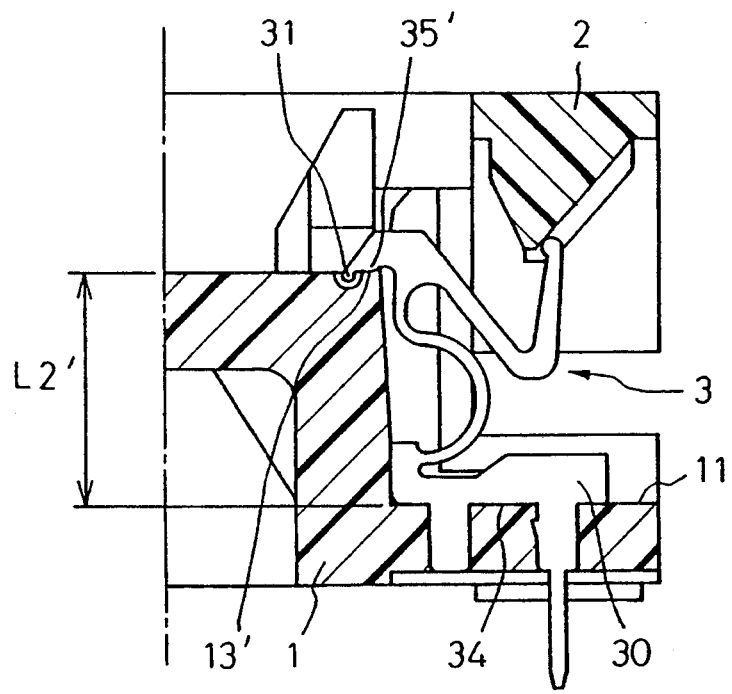
FIG. 10 is a cross-sectional view showing the regular condition of the IC socket before the test according to a further embodiment of the present invention.
Figures 11A, 11B:
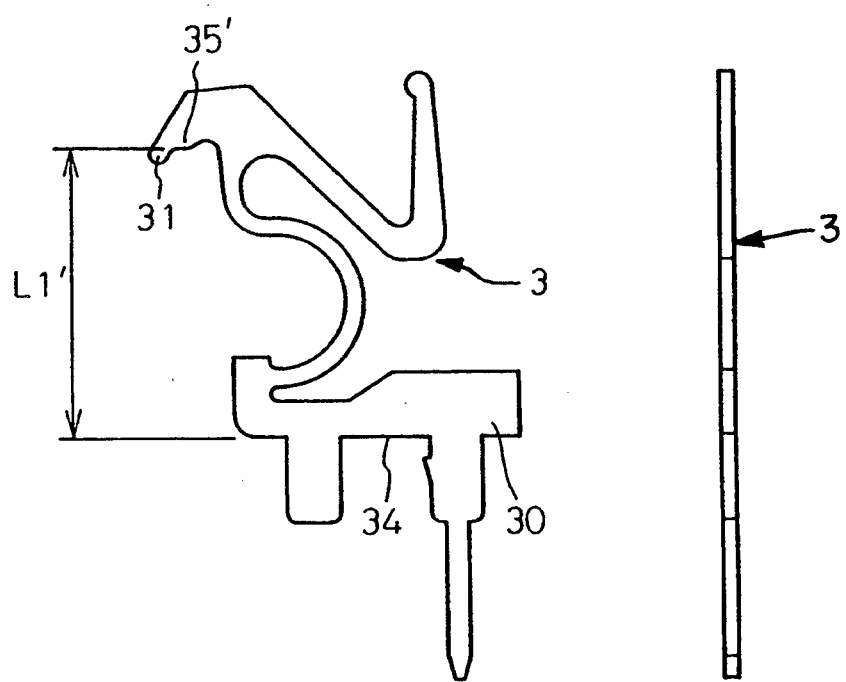
FIG. 11a is an elevational view showing a single contact of the IC socket before installation according to a further embodiment of the present invention and FIG. 11b is a side view.

FIGS. 10 and 11 respectively show a further embodiment according to the present invention. In this embodiment, a portion of the socket body 1 with which the contact portion 31 comes in contact is concave to prevent the contact portion 31 from contacting the socket body 1. In addition, as in case of the above-described embodiment, the contact 3 is provided with the contact point portion 35' which comes in contact with the socket body 1 near the contact portion 31, and the socket body 1 is provided with the IC package mounting portion 13', which mates with the contact point portion 35'. Since a similar effect as in case of the above-described embodiment can also be obtained, a stable engaging force can be obtained to meet the variations of thickness of the lead L and the contact portion 31 can be free from depositing of foreign matter which is produced due to wearing of the material forming the socket body 1 during operation.

In addition, in this embodiment, the position of the contact portion 31 before mounting the IC package P can be lower than the engaging position with the lead L when the IC package P is mounted and therefore the displacement (preloading) of the contact 3 can be large. Accordingly, this embodiment is also advantageous in that the control of the engaging force of the contact 3 and the lead L can be designed in a wide range of displacement.

Figure 12:
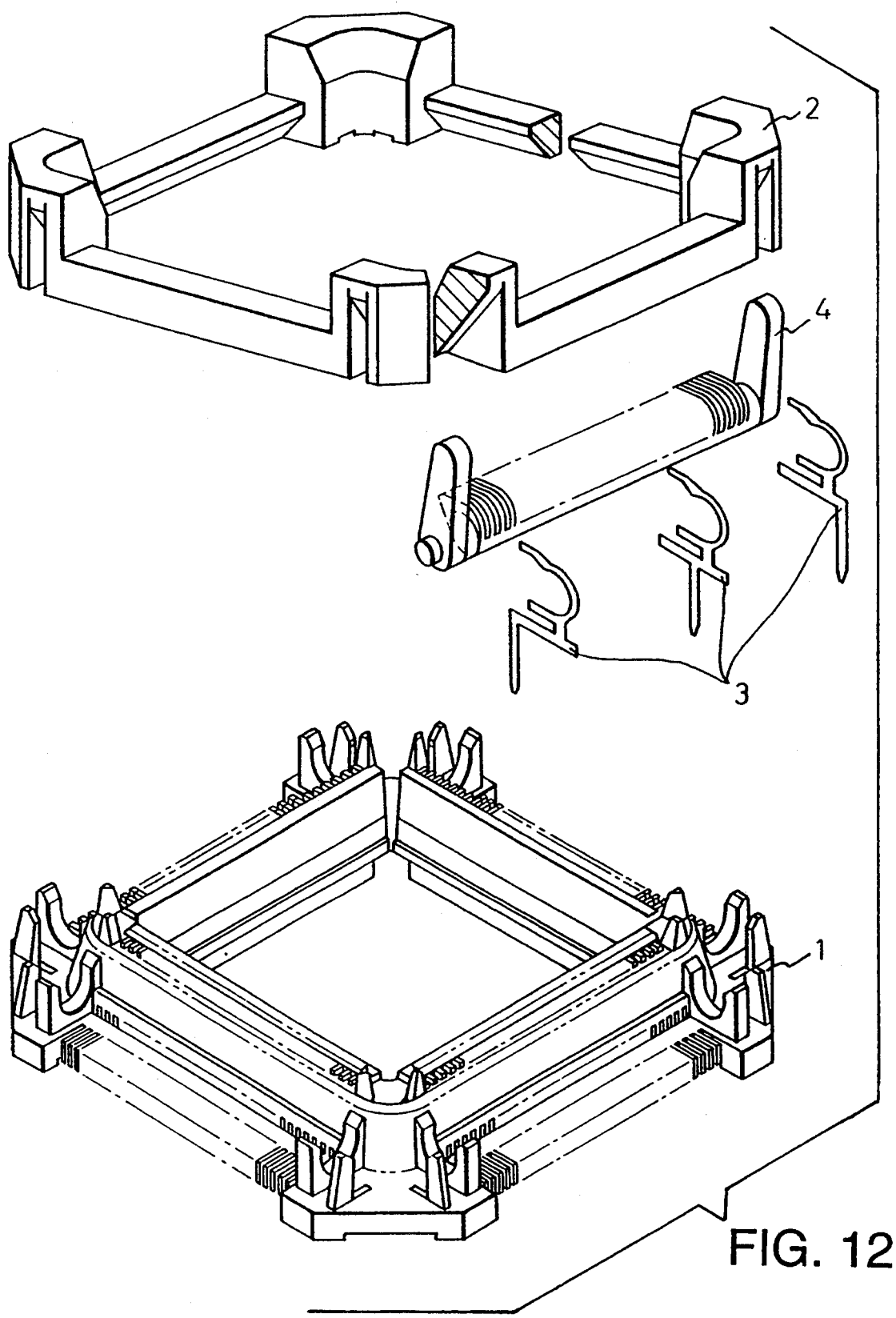
FIG. 12 is a perspective view showing the overall construction of the IC socket according to a further embodiment of the present invention.
Figure 13:
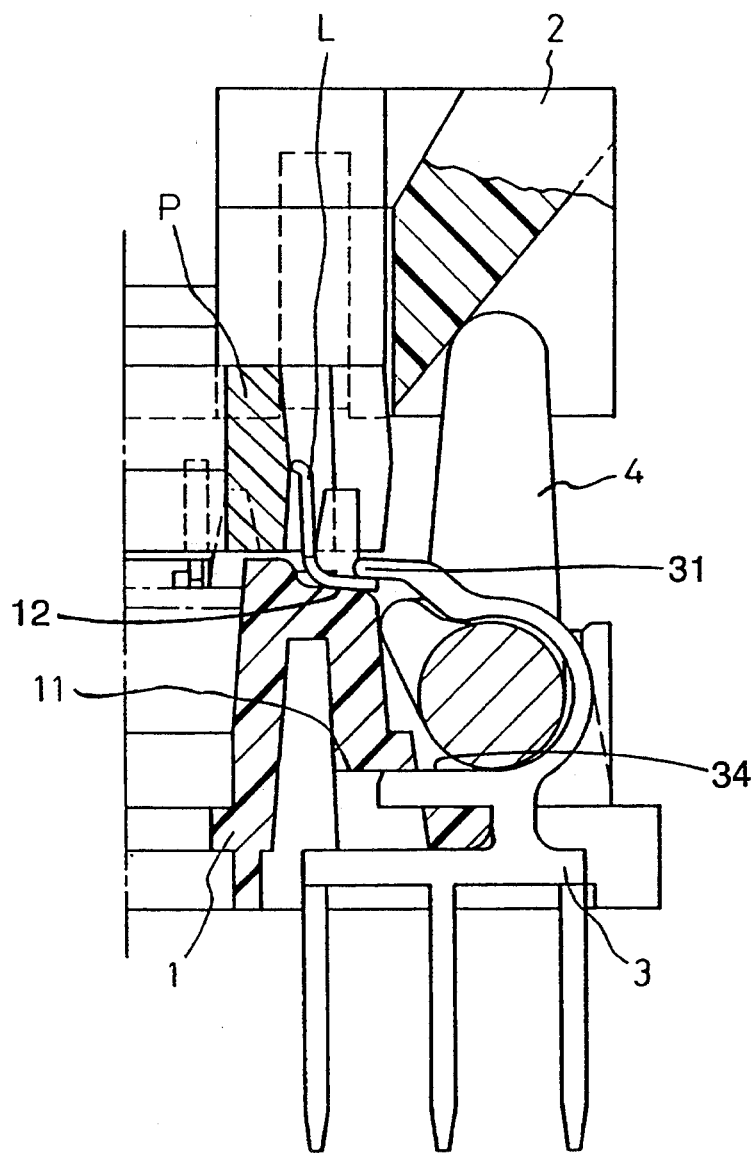
FIG. 13 is a cross-sectional view showing the IC package mounting condition of the IC socket according to a further embodiment of the present invention.
Figure 14:
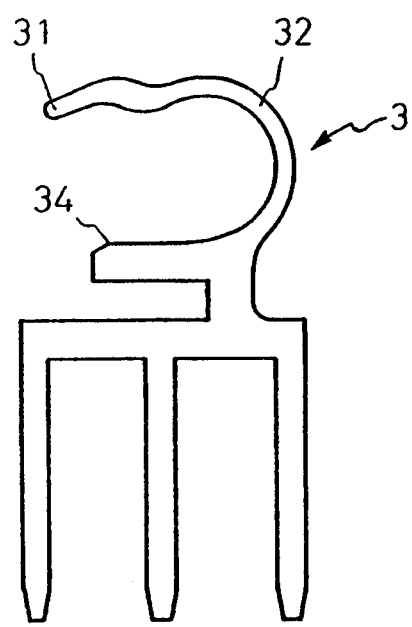
FIG. 14 Is an elevational view showing a single contact of the IC socket before installation according to a further embodiment of the present invention.
Figure 15:
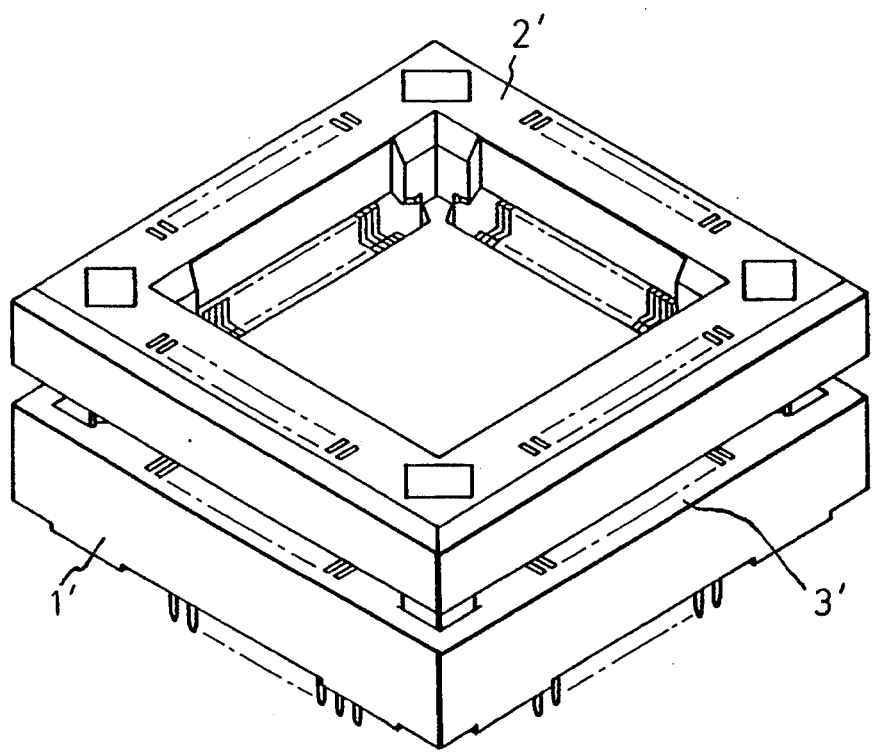
FIG. 15 is a perspective view showing the regular condition of the conventional IC socket before inspection according to the U.S. Pat. No. 4,886,470.
Figure 16:
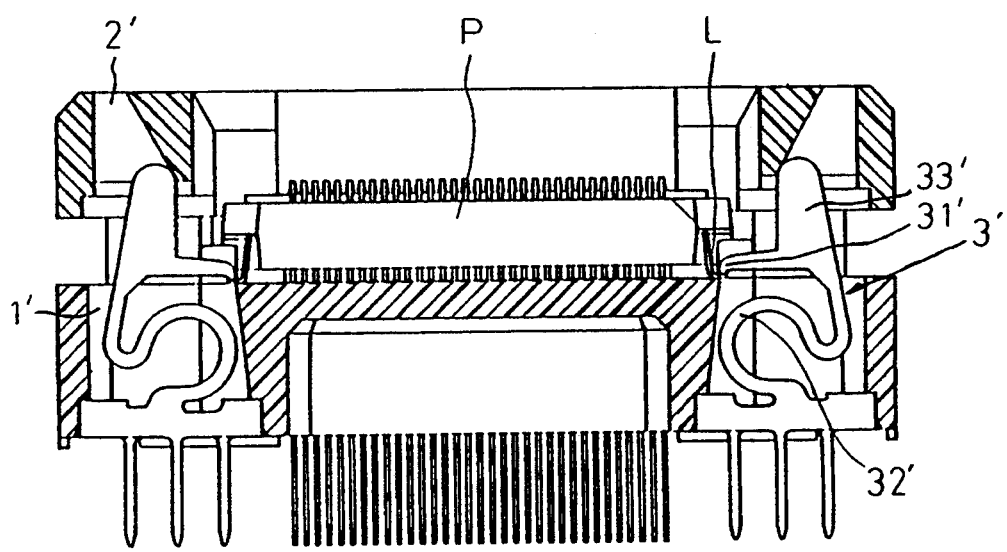
FIG. 16 is a cross-sectional view showing the IC package mounting condition of the conventional IC socket according to the U.S. Pat. No. 4,886,470.
Figure 17:
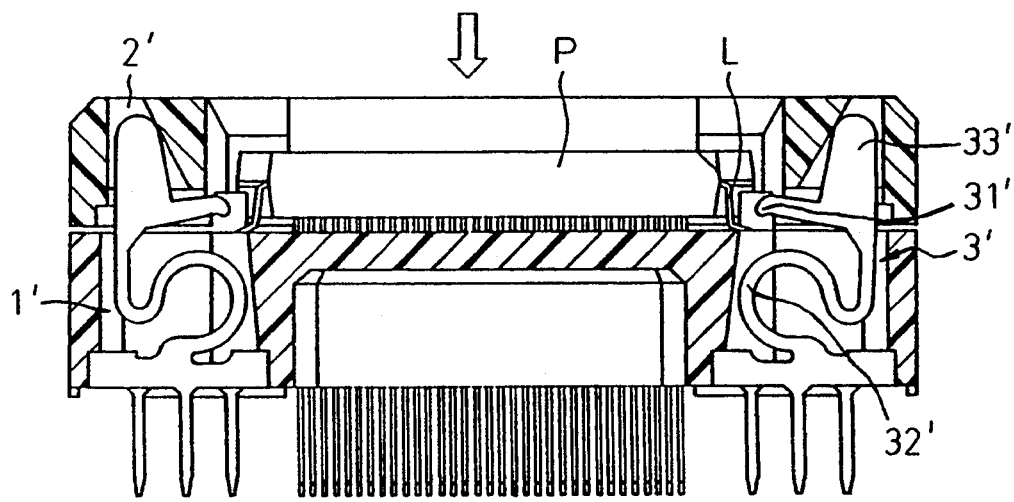
FIG. 17 is a cross-sectional view showing the operating condition of the conventional IC socket according to the U.S. Pat. No. 4,886,470.
Figure 18:
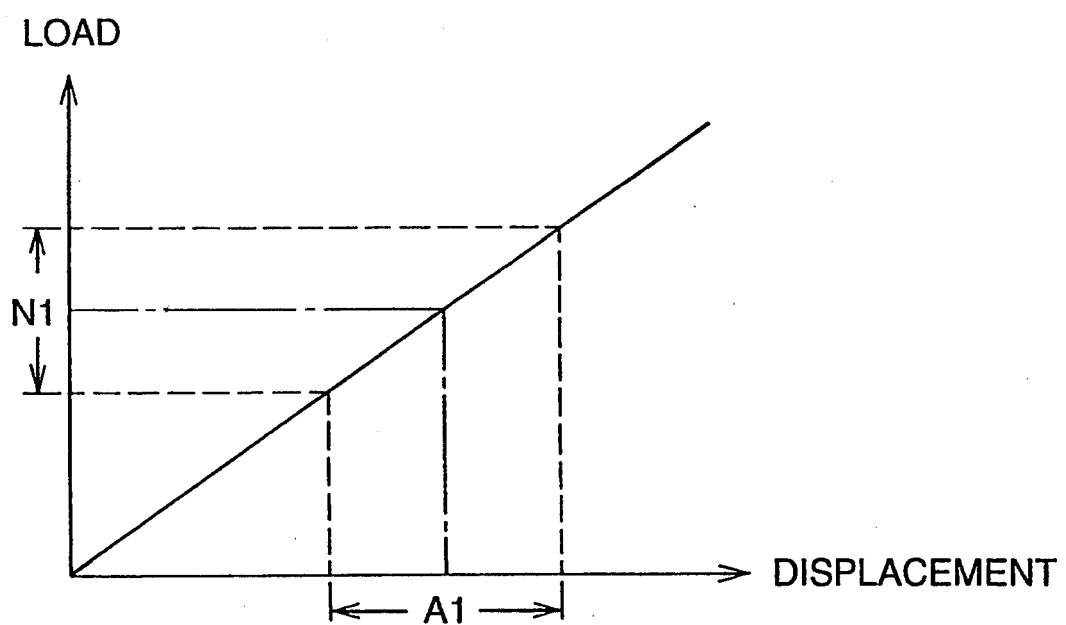
FIG. 18 is a load-displacement characteristic diagram of the contacts of the conventional IC socket according to the U.S. Pat. No. 4,886,470.

FIGS. 12 to 14 respectively show another embodiment of the construction of the IC socket provided with a cam lever 4, in addition to the socket body 1, contacts 3 and the cover 2, in accordance with the present invention. When the cover 2 of the IC socket is pushed down, the above-described cam lever 4 comes in engagement with the cover 2 and is rotated outwardly, and moreover, the contact portion 31 (FIG. 14) of the contact 3 is displaced diagonally upwardly so that the IC package P can be remounted with engagement of the contact 3 and the cam lever 4. Since a similar effect to the above-described embodiment can be obtained in this case, a stable engaging force can be obtained to meet the variations in thickness of the lead L.

As described above, employing the fixed relative dimensions of a single contact and the socket body, that is, reducing the distance from the contact portion for the lead L to the bottom side of the fixing portion to be smaller than the distance from the bottom surface of the contact fixing portion of the socket body to the mounting portion for the IC package P, the present invention allows for the provision of a depressing force to the contact fixing portion which engages with the lead L before the IC package is mounted and therefore a stable engaging force can be obtained to meet the variations in thickness of the lead L and a stable electrical contact resistance can be obtained.

I claim:

1. An IC socket which comprises a socket body having a mounting surface and an IC package mounting portion, a plurality of contacts which are arranged on said socket body to be electrically engaged with a plurality of leads of an IC package having gull wing-type leads, and a cover which is provided to be vertically movable in relationship to said socket body to engage said contacts to displace them outwardly against their resilience to allow the contacts to move out of said electrical engagement when said cover is moved down toward said socket body, said plurality of contacts respectively having a fixing portion which is fixed to said socket body at said mounting surface, a contact portion for electrical engagement with a lead of said IC package when mounted on said IC package mounting portion, a cantilever portion which enables the release of the lead and contact from said electrical engagement by rotating said contact portion, and an engaging cam portion which comes into sliding engagement with said cover for rotating said contact portion, wherein a distance from said contact portion to a bottom side of said contact fixing portion of a single contact before it is inserted into the socket body is smaller than the same distance after mounting the contact in the socket body to provide a preloaded engaging force.

2. An IC socket which comprises a socket body having a mounting surface and an IC package mounting portion, a plurality of contacts which are arranged on said socket body to be engaged with leads of an IC package having full wing-type leads When said IC package is mounted on said IC package mating portion, and a cover which is provided to be vertically movable in relationship to said socket body and to engage said contacts to displace them outwardly against their resilience to allow the contacts to move out of said electrical engagement when said cover is moved down toward said socket body, said plurality of contacts respectively having a fixing portion which is fixed to said socket body at said mounting surface, a contact portion for electrical engagement with a lead of said IC package, a cantilever portion which enables the release of the lead and contact from electrical engagement by rotating said contact portion, and an engaging portion which comes into sliding engagement with said cover, wherein said plurality of contacts respectively have a contact point portion near said contact portion, which comes into contact with said socket body at said IC package mounting portion, thus displacing said contact portion from engagement with said IC package mounting portion.

3. An IC socket according to claim 2 wherein the distance from said contact point portion of said contact to the bottom surface of said contact fixing portion of said single contact before it is inserted into the socket body is smaller than the same distance after mounting the contact in the socket body to provide a preloaded engaging force between the contact point portion and the IC package mounting portion of the socket body.

4. An IC socket according to claim 2 wherein said IC package mounting portion is provided with a concave surface to receive said contact portion adjacent said mating portion and the distance from said contact point portion of said contact to a bottom surface of said contact fixing portion of said single contact before it is inserted into the socket body is smaller than the same distance after mounting the contact in the socket body to provide a preloaded engaging force between the contact point portion and the IC package mounting portion of the socket body.

* * * * *

UNITED STATES PATENT AND TRADEMARK OFFICE
CERTIFICATE OF CORRECTION

PATENT NO. : 5,368,497
DATED : November 29, 1994
INVENTOR(S) : Takayuki Nagumo

It is certified that error appears in the above-indentified patent and that said Letters Patent is hereby corrected as shown below:

Column 3, Line 30, "Is an" should read -- is an --.

Column 4, Line 39, "mating portion" should read -- portion --.

Column 6, Line 14, "leads When" should read -- leads when --.

Column 6, Line 38, "to the bottom" should read -- to a bottom --.

Signed and Sealed this

Thirtieth Day of May, 1995

Attest:

BRUCE LEHMAN

*Attesting Officer*    *Commissioner of Patents and Trademarks*